(12) United States Patent
Jeong

(10) Patent No.: US 8,541,277 B2
(45) Date of Patent: Sep. 24, 2013

(54) NON-VOLATILE MEMORY DEVICE AND METHOD FOR FABRICATING THE SAME

(75) Inventor: Yong-Sik Jeong, Cheongju-si (KR)

(73) Assignee: Magnachip Semiconductor Ltd., Cheongju-si (KR)

( * ) Notice: Subject to any disclaimer, the term of this patent is extended or adjusted under 35 U.S.C. 154(b) by 6 days.

(21) Appl. No.: 13/372,767

(22) Filed: Feb. 14, 2012

(65) Prior Publication Data
US 2012/0142153 A1 Jun. 7, 2012

Related U.S. Application Data

(62) Division of application No. 11/319,567, filed on Dec. 29, 2005, now Pat. No. 8,143,663.

(30) Foreign Application Priority Data

Mar. 8, 2005 (KR) .......................... 10-2005-0019089

(51) Int. Cl.
*H01L 21/336* (2006.01)

(52) U.S. Cl.
USPC .... 438/264; 438/257; 438/305; 257/E21.209; 257/E21.422

(58) Field of Classification Search
USPC ................. 438/257, 258, 264; 257/E21.209, 257/E21.422, E21.682, E21.683
See application file for complete search history.

(56) References Cited

U.S. PATENT DOCUMENTS

| | | | |
|---|---|---|---|
| 6,204,126 B1 | 3/2001 | Hsieh et al. | |
| 6,531,734 B1 | 3/2003 | Wu | |
| 6,570,213 B1 | 5/2003 | Wu | |
| 7,148,098 B2 | 12/2006 | Huang et al. | |
| 2002/0100926 A1 | 8/2002 | Kim et al. | |
| 2003/0198086 A1 | 10/2003 | Shukuri | |
| 2004/0077144 A1 | 4/2004 | Hsieh | |
| 2005/0176202 A1* | 8/2005 | Hisamoto et al. ............. 438/257 |
| 2006/0186460 A1 | 8/2006 | Choi et al. | |

FOREIGN PATENT DOCUMENTS

| | | |
|---|---|---|
| JP | 02-003986 A | 1/1990 |
| JP | 2001-028403 A | 1/2001 |
| JP | 2002-050706 A | 2/2002 |
| JP | 2002-368077 A | 12/2002 |
| JP | 2003-086716 A | 3/2003 |
| JP | 2004-266279 A | 9/2004 |

OTHER PUBLICATIONS

Japanese Office Action issued Apr. 3, 2012 in counterpart Japanese Patent Application No. 2005-379703 (5 pages, in Japanese).

* cited by examiner

*Primary Examiner* — Charles Garber
*Assistant Examiner* — Abdulfattah Mustapha
(74) *Attorney, Agent, or Firm* — NSIP Law

(57) ABSTRACT

A method of fabricating a non-volatile memory device is provided. The method includes sequentially forming a tunnel insulation layer and a first polysilicon layer on a substrate, patterning the first polysilicon layer and the tunnel insulation layer, forming a dielectric layer to cover the patterned first polysilicon layer and the patterned tunnel insulation layer, forming a gate insulation layer on the substrate where the substrate is exposed, forming a second polysilicon layer to cover the dielectric layer, and forming a first floating gate and a second floating gate a fixed distance apart from each other, the forming of the first and second floating gates including etching middle portions of the second polysilicon layer, the dielectric layer, the patterned first polysilicon layer, and the patterned tunnel insulation layer, and separating the etched layers into two parts.

16 Claims, 15 Drawing Sheets

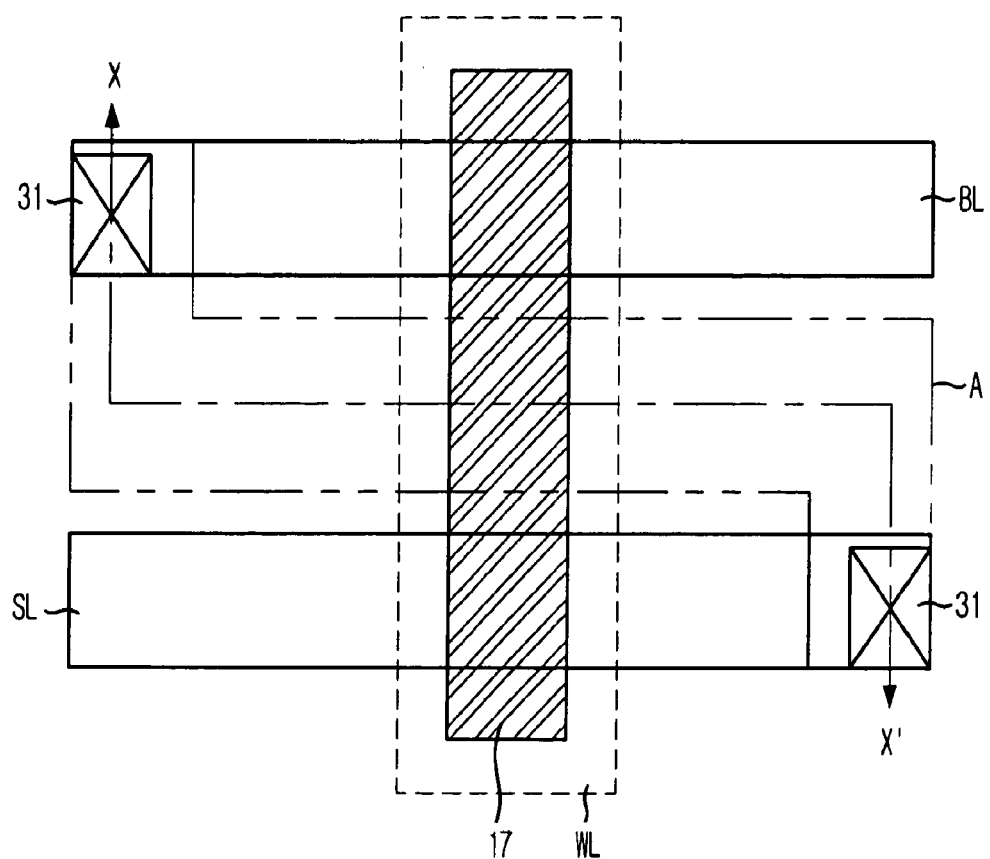

NON-VOLATILE MEMORY DEVICE AND METHOD FOR FABRICATING THE SAME

CROSS-REFERENCE TO RELATED APPLICATIONS

This application is a Division of pending U.S. patent application Ser. No. 11/319,567 filed on Dec. 29, 2005, which claims the benefit under 35 U.S.C. §119(a) of Korean Patent Application No. 10-2005-0019089 filed on Mar. 8, 2005, in the Korean Intellectual Property Office, the entire disclosure of which is incorporated herein by reference for all purposes.

BACKGROUND

1. Field

The present invention relates to a non-volatile memory device, a method for fabricating the same, and a method for fabricating a semiconductor device by using the same; and more particularly, to a non-volatile memory device having a split gate type cell structure, a method for fabricating the same and a method for fabricating a semiconductor device by using the same.

2. Description of Related Art

Generally, although an electric power is blocked, data stored in a memory cell of a non-volatile memory device is not damaged and thus, the non-volatile memory device has been widely used for a personal computer (PC) bias and for data storing of a set-top box, a printer and a network server. Recently, the non-volatile memory device has been used for a digital camera, a cellular phone and a smart card widely spread for public use.

A flash memory device and an electrical erasable programmable read only memory (EEPROM) device are widely used as a representative non-volatile memory device. A cell program operation of the EEPROM device is performed by using a hot electron injection method and an erasion operation is performed by using a fouler nordheim (F-N) tunneling method.

As for the hot electron injection method, a voltage is transferred to a cell drain and thus, a hot electron is formed in the drain side. Afterwards, a high voltage is transferred to a control gate, thereby injecting the hot electron formed in the drain side to a floating gate. Thus, a threshold voltage of the cell is increased. As for the F-N tunneling method, a high voltage is transferred to a source or a substrate and then, an electron injected to a floating gate by a program operation is discharged, thereby decreasing a threshold voltage of a cell.

A cell of the EEPROM device is divided as an electrically tunneling oxide (ETOX) cell of a simply stacked structure and a split gate type cell comprised of two transistors per a cell.

The ETOX cell is formed in a stacked structure of a floating gate for storing electric charges forming a gate and a control gate to which an operation power is transferred. Meanwhile, the split gate type cell uses a selection transistor and a cell transistor as one selection gate and is formed in a structure in which a predetermined portion of the selection gate is overlapped with a floating gate, and the remaining portion of the selection gate is placed on a substrate surface horizontally.

A cell size of the ETOX cell is very small compared with that of the split gate type cell and thus, the ETOX cell is more advantageous to a high integration. Since the ETOX cell uses the hot electron injection method during a program operation, there is an advantage a program current is very large. However, during the program operation and a read operation, interference between the cells is happened, and during an erasion operation, an excessive erasion is happened. Thus, there is a disadvantage in that an operation reliability of the device is degraded.

Meanwhile, the split gate type cell has a large cell size and accordingly, the split gate type cell is not suitable for a high integrated memory device. However, the split gate type cell has been widely used in a memory device in a semiconductor business due to good reliability of the split gate type cell during various operations. The split gate type cell hardly generates the excessive erasion problem because the selection transistor maintains a threshold voltage of the cell constantly. That is, after the erasion operation, although the floating gate shows a depletion property, a whole unit cell recognizes the threshold voltage of the selection transistor.

Accordingly, because of the above-described advantages of the split gate type cell, the split gate type cell has been widely used for the semiconductor devices. However, a channel length of the selection transistor of the spite gate type cell is determined by a lithography process, the channel length of the selection transistor may not be uniform according to an alignment technology of a lithography apparatus.

Accordingly, to solve the above limitations, the selection transistor of the split gate type cell is formed in a self-align method. That is, the split gate type cell having the selection transistor formed through the self-align method is conventionally suggested.

Hereinafter, with references to FIG. 1 and FIGS. 2A to 2I, a structure of the split gate type cell formed through the conventional self-align method and a method for fabricating the same will be briefly explained.

FIG. 1 is a top view illustrating a unit cell of a conventional self-aligned split gate type cell. FIGS. 2A to 2I are cross-sectional views illustrating a method for fabricating the conventional self-aligned split gate type cell. Herein, two split gate type cells operated in a pair, and a method for fabricating a semiconductor device in which a logic device is simultaneously formed is illustrated. Furthermore, a split gate type cell formed through FIGS. 2A to 2I is shown through the cross-sectional view taken along a line X-X' shown in FIG. 1.

As shown in FIG. 1 and FIG. 2A, a device isolation layer 11 is formed in a substrate 10 and thus, a region which the split gate type cell will be formed (hereinafter, referred to as a cell region), and a logic region in which a logic device will be formed or a peripheral region (hereinafter referred to as a pen region) are defined.

Subsequently, as shown in FIG. 2B, a tunnel oxide layer 12 is formed on the substrate 10 provided with the device isolation layer 11. On the tunnel oxide layer 12, a first polysilicon layer 13 for a floating gate, an inter-poly dielectric (IPD) layer (not shown) and a hard mask layer 14 are sequentially deposited.

Subsequently, as shown in FIG. 2C, a mask process is performed and then, a first photoresist pattern 15 for forming a floating gate is formed on the hard mask layer 14.

Next, an etching process 16 is performed by using the first photoresist pattern 15 and thus, a first floating gate 17A and a second floating gate 17B (either of which is represented by a floating gate 17 as illustrated in FIG. 1) are formed on the substrate 10 of the cell region. Herein, reference numerals 12X, 13X and 14X denote the patterned tunnel oxide layers, the patterned first polysilicon layers, and the patterned hard mask layers.

Subsequently, as shown in FIG. 2D, a stripping process is employed, thereby removing the first photoresist pattern 15. Afterwards, an etching process 16 is employed and thus, the patterned hard mask layers 14x and the patterned IPD layer are removed.

Next, an insulation layer is deposited and then, a dry etching process is performed. Afterwards, a plurality of dielectric layers 18 is formed by using an inter-poly oxide layer to cover the first floating gate 17A and the second floating gate 17B, respectively.

Next, as shown in FIG. 2E, a gate insulation layer 19 is formed on an upper portion of the substrate 10. At this time, the gate insulation layer 19 can be formed in different thicknesses on the cell region and the pen region. For instance, a first gate insulation layer 19A is formed on the substrate 10 of both the cell region and the peripheral region. Afterwards, a photolithography process is employed, thereby removing the first gate insulation layer 19A existing on the substrate 10 of the pen region. Next, an oxide process is performed onto the substrate 10 of the peri region and thus, a second gate insulation layer 19B is formed in a different thickness from that of the first gate insulation layer 19A on the substrate 10 of the peri region.

Next, a second polysilicon layer 20 for a selection gate of the cell region or a gate electrode of the pen region is deposited over a height difference of an upper portion the structure provided with the gate insulation layer 19.

Next, as shown in FIG. 2F, a mask process is employed, thereby forming a second photoresist pattern 21 for forming a gate electrode of the pen region on the second polysilicon layer 20.

Next, an etching process 22 is performed by using the second photoresist pattern 21 as a mask and thus, the second polysilicon layer 20 and the second gate insulation layer 19B are etched. Accordingly, a peripheral gate electrode 23 of a transistor for a logic device is formed on the substrate 10 of the pen region. Herein, reference numerals 19B' and 20' denote the patterned second gate insulation layer and the patterned second polysilicon layer, respectively.

Next, as shown in FIG. 2G, through a stripping process, the second photoresist pattern 21 is removed. Afterwards, a mask process is performed and then, a third photoresist pattern 24 for forming a selection gate of the cell region is formed.

Next, an etching process 25 is performed by using the third photoresist pattern 24 as a mask, thereby forming a first selection gate 20A and a second selection gate 20B on an upper portion and sidewalls of the individual dielectric layer 18 to cover the dielectric layers 18 of the first floating gate 17A and the second floating gate 17B. At this time, the first selection gate 20A and the second selection gate 20B serve a role as a word line (WL). Herein, during the etching process 25, the first selection gate 20A and the second selection gate 20B are self-aligned on the sidewalls of the first floating gate 17A and the second floating gate 17B in a predetermined thickness. In addition, a reference numeral 19C denotes the patterned first gate insulation layers.

Next, as shown in FIG. 2H, through a stripping process, the third photoresist pattern 24 is removed.

Next, a lightly doped drain (LDD) ion impanation process is performed and thus, a plurality of LDD ion implantation regions 26 are formed in the substrate 10 in both sides of the first selection gate 20A, the second selection gate 20B and the peripheral gate electrode 23.

Next, a plurality of spacers 27 are formed on sidewalls of the first selection gate 20A, the second selection gate 20B and the peripheral gate electrode 23 by using an insulation layer.

Next, a source/drain ion implantation process is employed by using the spacers 27 as a mask and thus, a plurality of source/drain regions 28A and 28B are formed beside the LDD ion implantation regions, 26 exposed in both sides of the spacers 27 in a thickness deeper than that of the LDD ion implantation regions 26. Accordingly, two split gate type cells are formed on the substrate 10 of the cell region.

Next, a self-aligned silicide (SALICIDE) process is performed and then, a plurality of silicide layers 29 are formed on the first selection gate 20A and the second selection gate 20B, the source/drain regions 28A and 28B, and the peripheral gate electrode 23.

Next, as shown in FIG. 2I, on the resulting structure provided with the silicide layers 29, an inter-layer insulation layer 30 is deposited. Afterwards, an etching process is performed, thereby forming a plurality of contact holes (not shown) exposing the source/drain regions 28A and 28B.

Next, a plurality of contact plugs 31 (illustrated in FIGS. 1 and 2I) are formed by depositing a conductive layer (not shown) buried in the contact holes. Then, a photolithography process is performed, thereby forming a plurality of interconnection line layers on the contact plugs 31 by using the conductive layer.

That is, a first interconnection line layer 32A connected to the common source region 28A existing in the substrate 10 between the two split gate type cells, and a plurality of second interconnection line layers 32B individually connected to the drain regions 28B through the contact plugs 31 formed in one side of each of the two split gate type cells are formed. Furthermore, a third interconnection line layer 32C connected to the drain region 28B through the contact plug 31 of the peri region is formed. At this time, the first interconnection line layer 32A serves a role as a source line SL or a ground line, and the second interconnection line layer 32B serves a role as a bit line BL.

Meanwhile, FIG. 3 is a top view illustrating a conventional memory cell array fabricated through FIGS. 2A to 2I. As shown in FIG. 3, a bit line BL and a source line SL are placed in parallel with a minimum line width throughout a whole cell region in the conventional memory cell array. A reference denotation A denotes an active region.

However, the split gate type cell fabricated through the aforementioned methods shown in FIGS. 2A to 2I provides the following limitations. With reference to FIG. 4, these limitations will be explained.

First, during an etching process of a second polysilicon layer for a selection gate, polymer is generated and thus, a selection gate pattern formed on a cell region is damaged (refer to a reference denotation B of FIG. 4). The damaged gate pattern functions as a foreign body, thereby inducing defects in products.

Secondly, in case of performing an excessive etching process to remove the polymer, sidewalls of the selection gate is irregularly formed and thus, spacers are not formed on the sidewalls of the selection gate. Accordingly, the selection gate and the substrate are short-circuited due to a silicide layer formed through a subsequent process (refer to a reference denotation C of FIG. 4).

Thirdly, in case that the silicide layer is not formed to prevent the short-circuit between the selection gate and the substrate, a contact resistance of a source/drain region and that of the selection gate are increased. Meanwhile, to reduce the contact resistance, a contact size should be increased. The increase in the contact size increases a whole size of a semiconductor device.

Fourthly, since the selection gate is deposited on an upper portion of a floating gate, an overall height of a memory cell is increased. Accordingly, a tilt ion implantation process cannot be performed to form the source/drain region, and a degree of difficulty of a contact and interconnection process subsequently performed is increased due to the increased height of a contact plug. As a result, yields of products and reliability are reduced.

Fifthly, the selection gate can be formed through a self-aligned method; however, the selection gate and the floating gate can be misaligned due to a process change and a device condition (refer to a reference denotation D in FIG. 4). This misalignment is increased as a thickness of the selection gate gets thinner. Recently, according to a micronized trend of the semiconductor device, the thickness of the selection gate has been getting thinner. Accordingly, the misalignment has eventually increased and thus, a size of the selection gate is changed. Hence, there is limitation that a uniformity of the memory cell is degraded.

Sixthly, a contact hole and a metal inter connection line are formed in a minimum size during an interconnection line process. Accordingly, a bit line, to which a high voltage is transferred, and a grounded source line are placed in parallel with a minimum line width throughout a whole cell region. Thus, a coupling phenomenon is generated due to a parasitic capacitance between the bit line and the source line. Furthermore, the coupling phenomenon causes an interference phenomenon between the bit line and the source line. The interference phenomenon may not only induce a faulty operation of a semiconductor device, but or degrade a program operation speed and an erasion operation speed. In addition, the interference phenomenon increases a data access time.

Lastly, since the selection gate per unit cell is formed on sidewalls of the floating gate, a channel length of the unit cell is increased. Herein, the channel length is calculated by a mathematical formula of (a length of the floating gate+(a length of the selection gate×2)). Accordingly, a current amount flowing in a channel region is decreased. Particularly, according to the micronized trend of the semiconductor device, if a data accessing voltage is decreased, the current amount of the memory cell is abruptly decreased.

SUMMARY

In one general aspect, there is provided a method of fabricating a non-volatile memory device, including sequentially forming a tunnel insulation layer and a first polysilicon layer on a substrate, patterning the first polysilicon layer and the tunnel insulation layer, forming a dielectric layer to cover the patterned first polysilicon layer and the patterned tunnel insulation layer, forming a gate insulation layer on the substrate where the substrate is exposed, forming a second polysilicon layer to cover the dielectric layer, forming a first floating gate and a second floating gate a fixed distance apart from each other, the forming of the first and second floating gates including etching middle portions of the second polysilicon layer, the dielectric layer, the patterned first polysilicon layer, and the patterned tunnel insulation layer, and separating the etched layers into two parts, forming a first selection gate and a second selection gate contacted with sidewalls of the separated two dielectric layers and isolated from the substrate by the gate insulation layer, and forming a plurality of source/drain regions in portions of the substrate exposed after the etching of the middle portions.

A general aspect of the method may further provide, before the forming of the source/drain regions, forming a plurality of lightly doped drain (LDD) ion-implantation regions in the portions of the substrate exposed after the etching of the middle portions, and forming a plurality of spacers on exposed sidewalls of the first and the second selection gates, and exposed sidewalls of the first and the second floating gates.

A general aspect of the method may further provide, after the forming of the source/drain regions, forming a plurality of silicide layers on the first and the second selection gates and the source/drain regions.

A general aspect of the method may further provide, after the separating of the etched layers, selectively etching the separated first and second polysilicon layers by an etch back process.

A general aspect of the method may further provide, after the forming of the first polysilicon layer, sequentially forming an inter-poly dielectric (IPD) layer and a hard mark layer on the first polysilicon layer.

A general aspect of the method may further provide that the IPD layer and the hard mask layer are etched before the etching of the first polysilicon layer and the tunnel insulation layer to thereby form a patterned hard mask layer and a patterned IPD layer.

A general aspect of the method may further provide that the patterned hard mask layer and the patterned IPD layer are used as etch masks to etch the first polysilicon layer and the tunnel insulation layer.

In another general aspect, there is provided a method of fabricating a non-volatile memory device, including providing a substrate defined as a cell region and a peripheral region, sequentially forming a tunnel insulation layer and a first polysilicon layer on the substrate, patterning the first polysilicon layer and the tunnel insulation layer on the cell region, the patterning including removing the first polysilicon layer and the tunnel insulation layer formed on the peripheral region, forming a dielectric layer to cover the patterned first polysilicon layer and the patterned tunnel insulation layer, forming a gate insulation layer on the substrate where the substrate is exposed, forming a second polysilicon layer to cover the dielectric layer, forming a peripheral gate electrode by patterning portions of the second polysilicon layer and the gate insulation layer formed on the peripheral region, forming a first floating gate and a second floating gate a fixed distance apart from each other, the forming of the first and second floating gates including etching middle portions of the second polysilicon layer, the dielectric layer, the patterned first polysilicon layer, and the patterned tunnel insulation layer formed on the cell region, and separating the etched layers into two parts, forming a first selection gate and a second selection gate contacted with sidewalls of the separated two dielectric layers and isolated from the substrate by the gate insulation layer, and forming a plurality of first source/drain regions and a plurality of second source/drain regions in respective portions of the substrate defined as the cell region and the peripheral region that were exposed after the etching of the middle portions.

Another general aspect of the method may further provide, before the forming of the first and second source/drain regions, forming a plurality of lightly doped drain (LDD) ion-implantation regions in the respective portions of the substrate defined as the cell region and the peripheral region that were exposed after the etching of the middle portions, and forming a plurality of spacers on exposed sidewalls of the first and the second selection gates, and exposed sidewalls of the first and the second floating gates.

Another general aspect of the method may further provide, after the separating of the etched layers, selectively etching the separated first and second polysilicon layer by an etch back process.

Another general aspect of the method may further provide, after the forming of the first polysilicon layer, sequentially forming an inter-poly dielectric (IPD) layer and a hard mask layer on the first polysilicon layer.

Another general aspect of the method may further provide that the IPD layer and the hard mask layer are etched before the etching of the first polysilicon layer and the tunnel oxide layer.

Another general aspect of the method may further provide that the patterned hard mask layer and the patterned IPD layer are used as etch masks to etch the first polysilicon layer and the tunnel insulation layer.

Other features and aspects may be apparent from the following detailed description, the drawings, and the claims.

BRIEF DESCRIPTION OF THE DRAWINGS

FIG. 1 is a top view illustrating a unit cell of a conventional self-aligned split gate type cell.

FIGS. 2A to 2I are cross-sectional views illustrating a method for fabricating a conventional self-aligned split gate type cell.

Figure 2A:
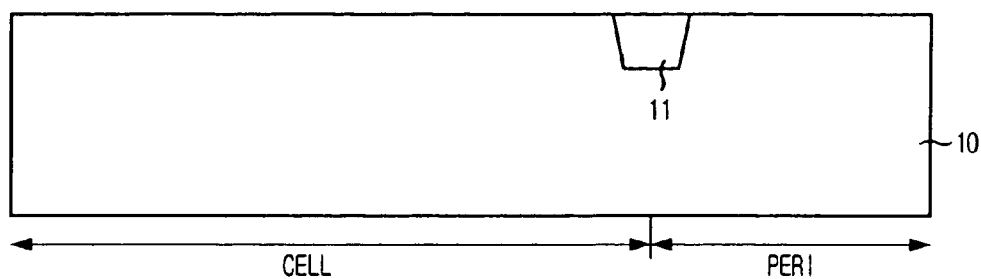
Figure 2B:
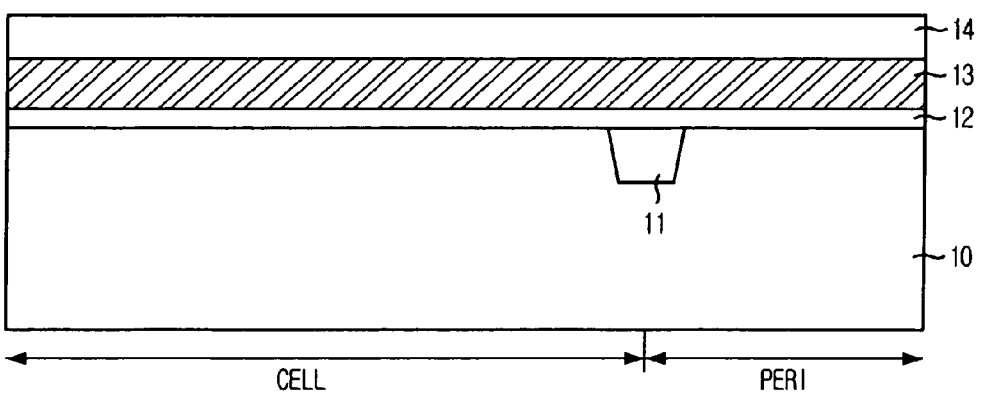
Figure 2C:
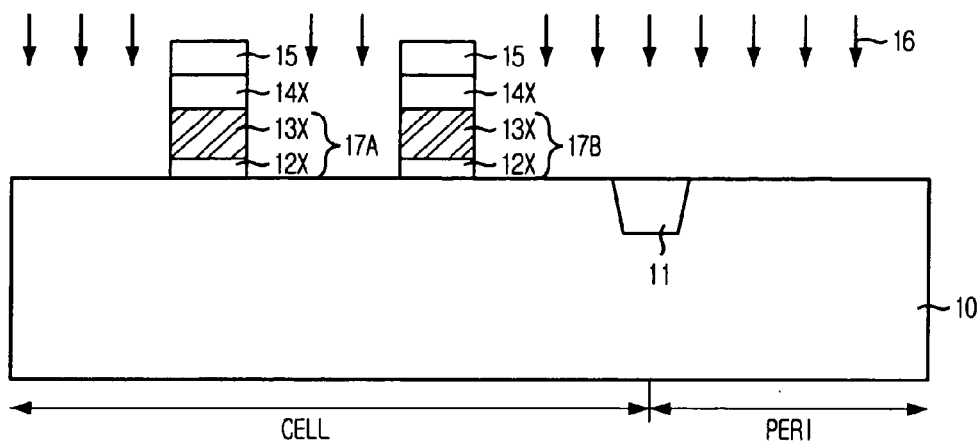
Figure 2D:
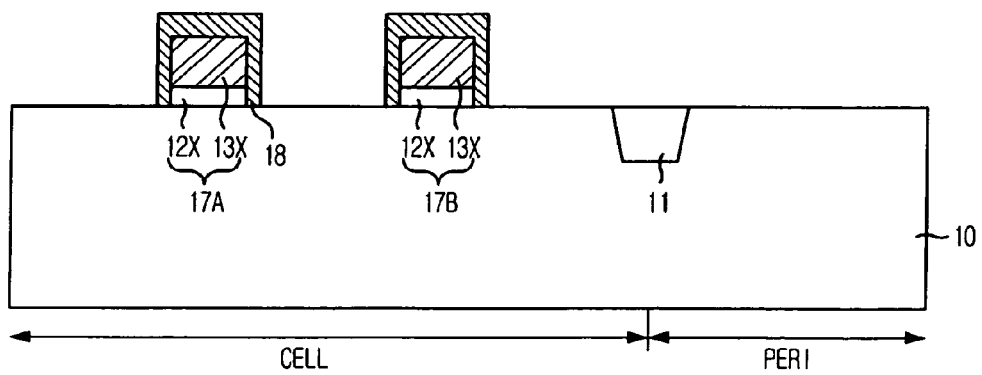
Figure 2E:
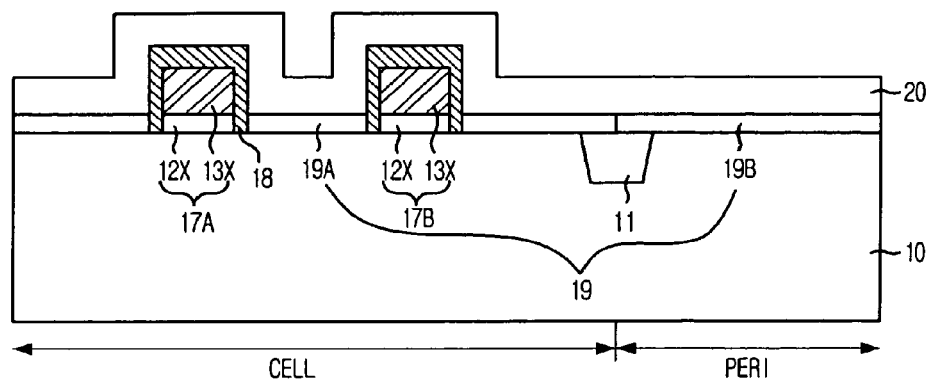
Figure 2F:
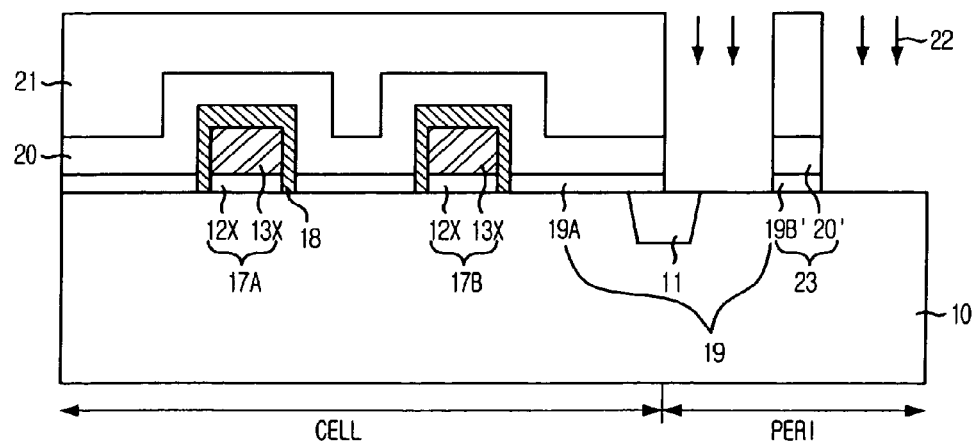
Figure 2G:
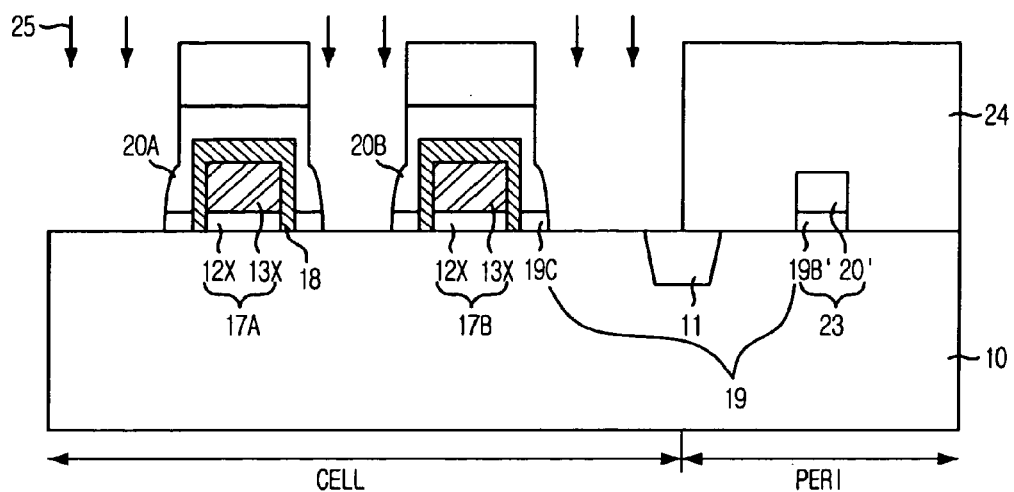
Figure 2H:
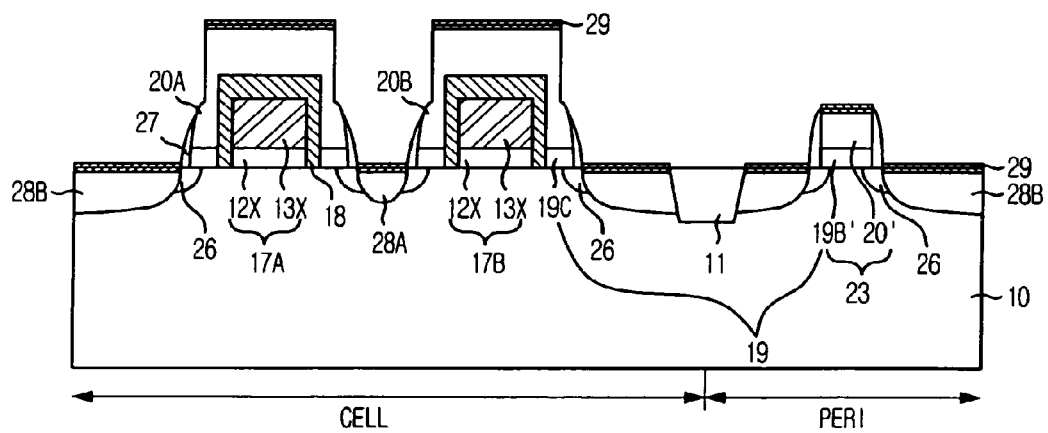
Figure 21:
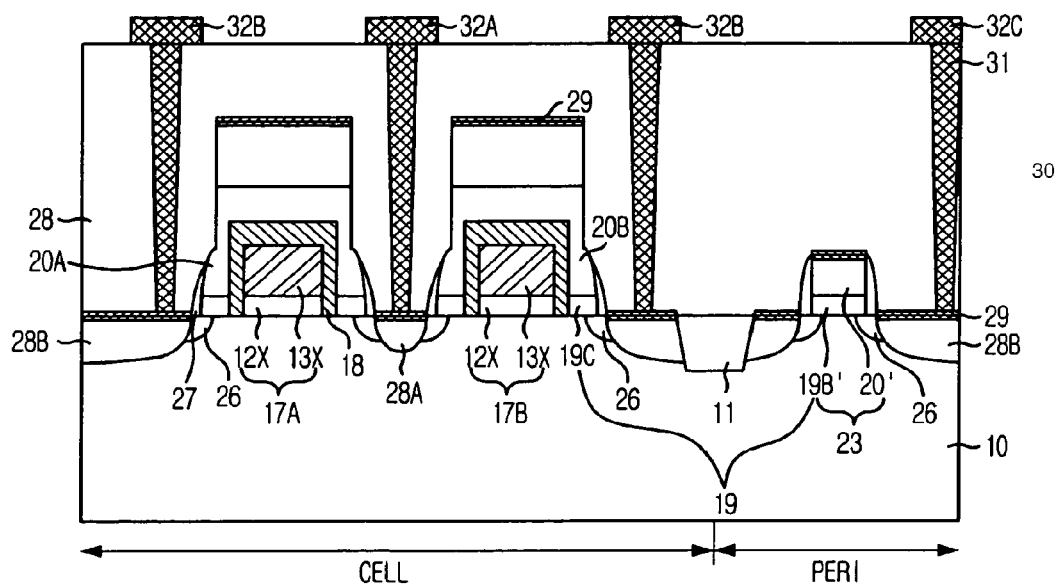
Figure 3:
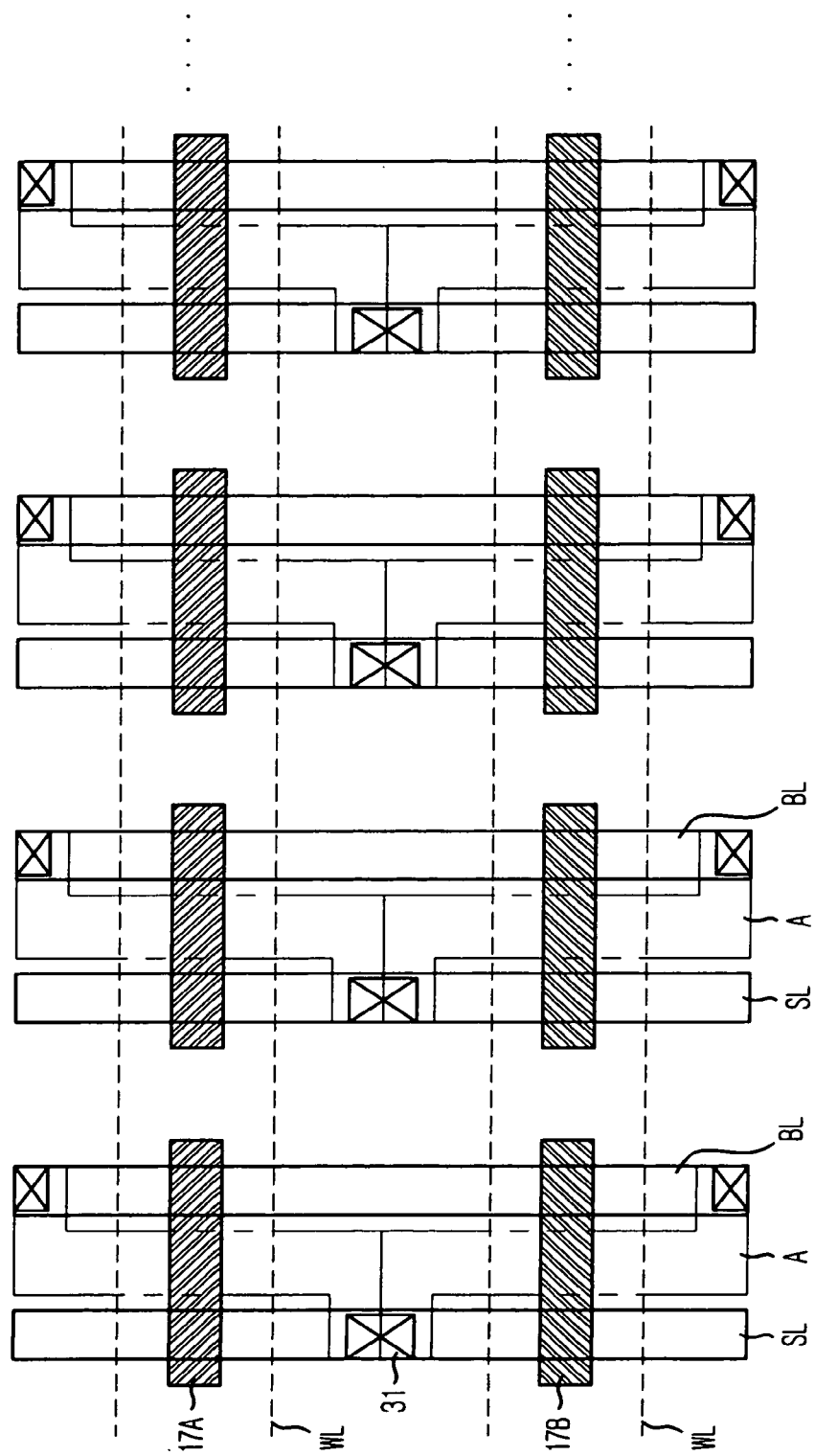
FIG. 3 is a top view illustrating a memory cell array of a conventional self-aligned split gate type memory cell.
Figure 4:
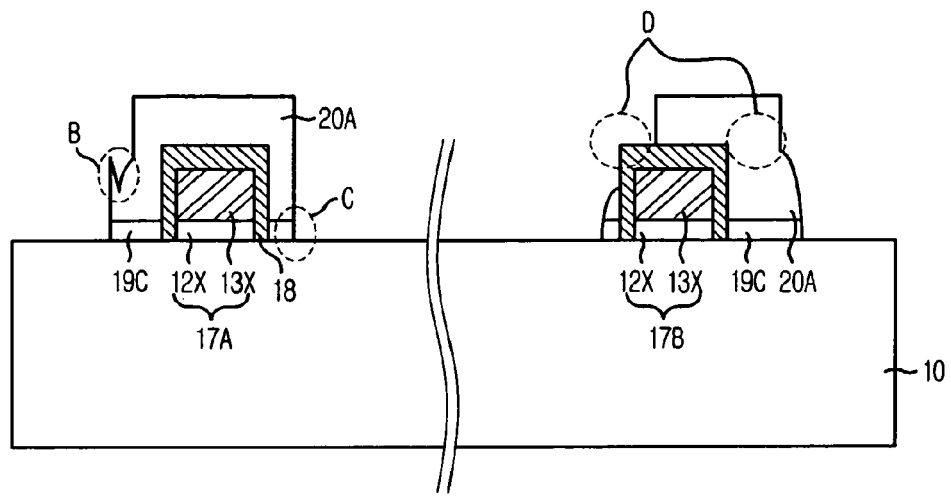
FIG. 4 is a cross-sectional view illustrating limitations caused by a conventional self-aligned split gate type cell.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods and apparatuses described herein. Accordingly, various changes, modifications, and equivalents of the apparatuses and methods described herein will be suggested to those of ordinary skill in the art. Also, descriptions of well-known functions and constructions may be omitted for increased clarity and conciseness.

It is understood that the features of the present disclosure may be embodied in different forms and should not be construed as limited to the example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

Figure 5:
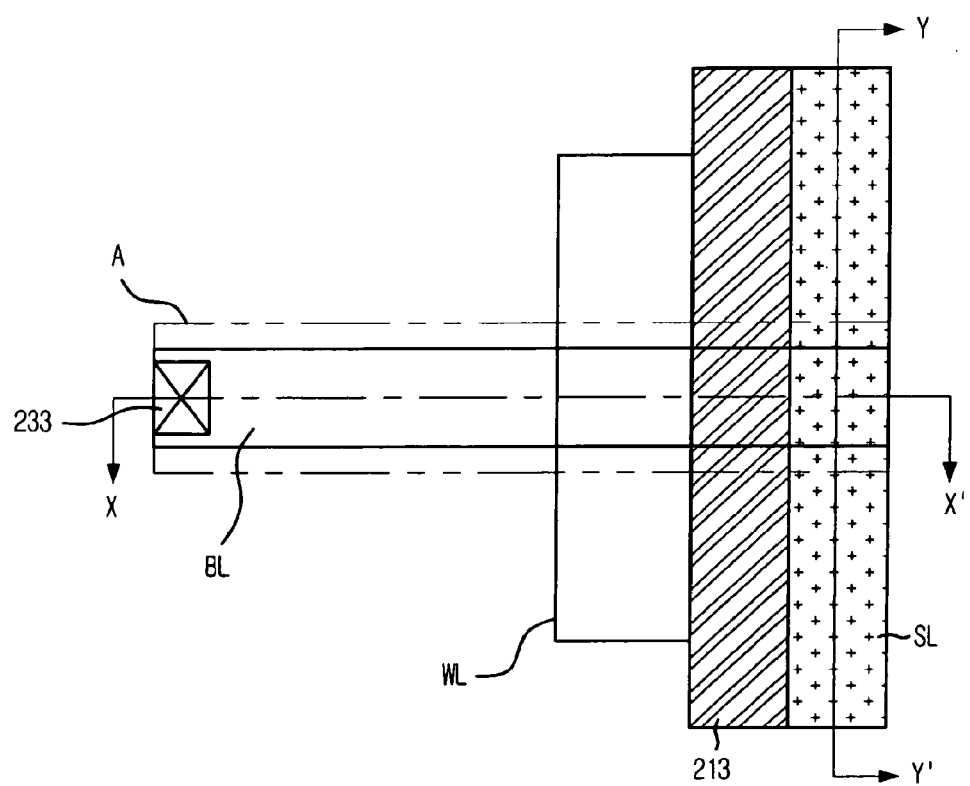
FIG. 5 is a top view illustrating an example of a unit cell of a non-volatile memory cell in accordance with a general aspect.
Figure 6:
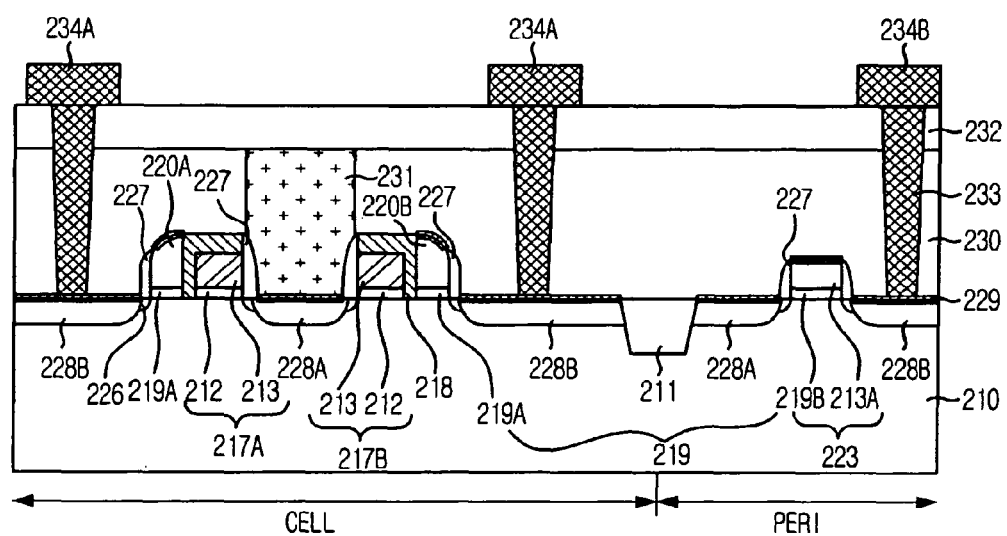
FIG. 6 is a cross-sectional view taken along a line X-X' shown in FIG. 5.
Figure 7:
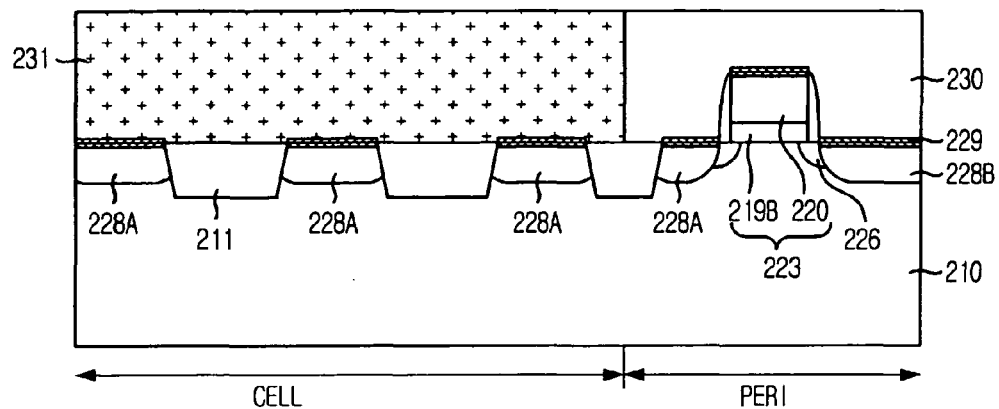
FIG. 7 is a cross-sectional view taken along a line Y-Y' shown in FIG. 5.

FIG. 5 is top view illustrating an example of a unit cell of a non-volatile memory device in accordance with a general aspect. FIG. 6 is a cross-sectional view taken along a line X-X' shown in FIG. 5. FIG. 7 is a cross-sectional view taken along a line Y-Y' shown in FIG. 5. Herein, FIGS. 6 and 7 are cross-sectional views simultaneously illustrating a pair of two memory cells and a logic device to explain the non-volatile memory device in accordance with a general aspect. In addition, the same reference numerals and the same reference denotations are used from FIGS. 5 to 7 to denote the same constitution elements.

As shown in FIGS. 5, 6 and 7, as for the non-volatile memory device in accordance with a general aspect, two unit cells are formed on a substrate 210 in a pair and commonly use one source region 228A. A source contact 231 is formed on the source region 228A. At this time, the source contact 231 is commonly connected to all of the memory cells, thereby serving a role as a source line SL.

First, the unit cell (hereinafter, referred to as a first cell) placed on the left side of a cell region in FIG. 6 includes a floating gate 213 separated from the substrate 210 by a tunnel oxide layer 212; a dielectric layer 218 covering an upper portion and a sidewall of the floating gate 213, a selection gate 220A formed on a sidewall of the dielectric layer 218 and separated from the substrate 210 by a gate insulation layer 219A; and a plurality of source and drain regions 228A and 228B respectively formed on one side of the floating gate 213 in which the selection gate is not formed and on one side of the selection gate 220A. Herein, the source region 228A also serves a role as a source region of the unit cell (hereinafter, referred to as a second cell) placed on the right side of the cell region in FIG. 6. A reference numeral 217A denotes a floating gate electrode.

Furthermore, the second cell shares the source region 228A with the first cell. The second cell is symmetric with respect to the first cell by the source region 228A between them. The second cell includes: a floating gate 213 separated from the substrate 210 by a tunnel oxide layer 212; a dielectric layer 218 covering an upper portion and a sidewall of the floating gate 213B; a selection gate 220B formed on a sidewall of the dielectric layer 218 and separated from the substrate 210 by a gate insulation layer 219A; a drain region 228B exposed to one side of the selection gate 220B; and the source region 228A shared with the first cell. Herein, a reference numeral 217B denotes a floating gate electrode.

As described above, the first cell and the second cell are symmetric with respect to the source region 228A between them. The selection gates 220A and 220B are formed to be overlapped with each sidewall of the floating gates 213 placed in an opposite side of the selection gates 220A and 220B, respectively. The first cell and the second cell share the source region 228A together.

Figure 8:
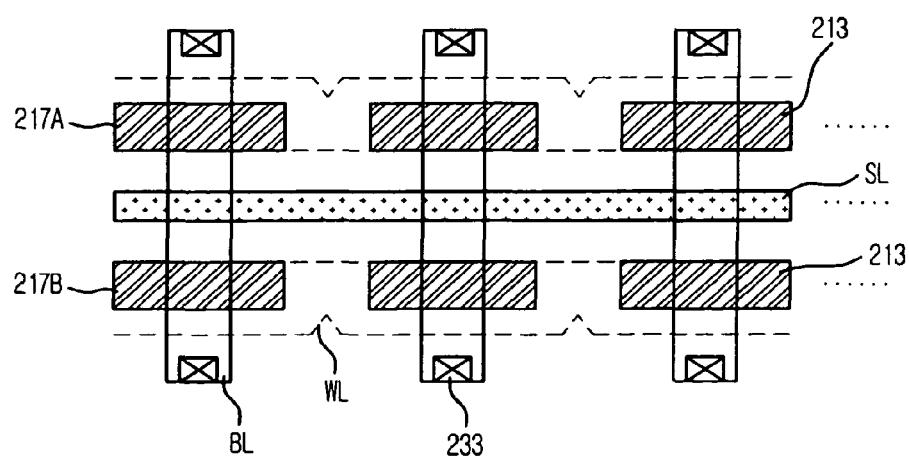
FIG. 8 is a top view illustrating an example of a memory cell array of a non-volatile memory cell in accordance with a general aspect.

FIG. 8 is a top view illustrating an example of a memory cell array of a non-volatile memory cell in accordance with a general aspect. A memory cell array comprised of the first cell and the second cell in a pair is illustrated in FIG. 8. Herein, the reference numerals shown in FIGS. 5 to 7 are identically used to denote the same constitution elements. In more details about the memory cell array of the non-volatile memory device, a plurality of bit lines BL are formed to vertically intersect a source line SL, and a plurality of word lines WL are formed to cover an external sidewall of the floating gates 213 of the first cell and the second cell. Herein, the word lines WL are the selection gates 220A and 220B shown in FIG. 6.

Although not explained, a reference denotation A shown in FIG. 5 denotes an active region.

The non-volatile memory device described above provides the following advantages.

First, it is possible to reduce a channel length of a whole memory cell by forming a selection gate per unit cell only on a sidewall of a floating gate and further, to reduce a size of a memory device. That is, a channel length of a unit cell of the conventional non-volatile memory device is obtained by an expression of "a length of a floating gate+(a length of a selection gate×2)"; however, a channel length of the unit cell in accordance with the present invention can be obtained by an expression of "a length of floating gate+a length of a selection gate". Accordingly, it is possible to reduce the channel length as much as a length of the selection gate per unit cell.

Secondly, the decreased channel length of the unit cell a not only reduces a size of a whole memory cell but also increases a cell current. At this time, a reduction rate of a cell size reaches at least approximately 20%.

Thirdly, as two unit cells commonly use a source region, a distance between a bit line and a source line gets wider. Accordingly, a coupling phenomenon due to a parasitic capacitance between the two lines is not happened and thus, an interference phenomenon is not generated. Accordingly, it is possible to prevent errors from being generated during a program operation and an erasion operation and to reduce a data access time.

Fourthly, since a selection gate does not exist on an upper portion of a floating gate, it is possible to reduce a height of a memory cell and further, to decrease a difficulty during an ion-implantation process and an etching process subsequently performed by the decreased height of the memory cell. Furthermore, a height of the floating gate can be freely controlled to increase a coupling ratio between the floating gate and the selection gate.

Fifthly, as a selection gate is formed only in a drain region, a channel hot electron implantation process can be applied during a program operation. Thus, a speed of the program operation can be 1,000 times faster than an F-N tunneling method.

Lastly, a distance between a bit line and a source line, i.e., a ground line, is wider compared to the conventional memory cell and thus, a subsequent process becomes simple. In addition, it is possible to prevent degradation in yields of products resulted from a conductive fine foreign body.

Hereinafter, with references to FIGS. 9A to 9J, a method of fabricating the non-volatile memory device in accordance with a general aspect will be explained. Herein, a method for fabricating a semiconductor device in which two unit cells and a transistor for a logic device are formed is explained for the sake of convenience.

Figure 9A:
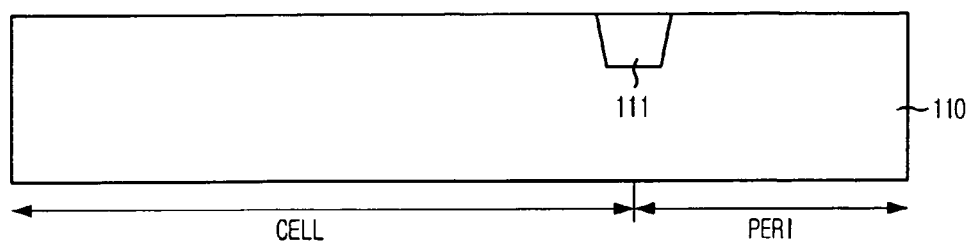
FIGS. 9A to 9J are cross-sectional views illustrating an example of a method of fabricating a non-volatile memory cell in accordance with a general aspect and a method of fabricating a semiconductor device by using the same.

First, as shown in FIG. 9A, a device isolation layer 111 (also illustrated by reference numeral 211 in FIGS. 6 and 7) is formed in a substrate 110, thereby defining a region (hereinafter, referred to as a cell region) where a split gate type cell will be formed, and a logic region or a peripheral circuit region (hereinafter, referred to as a peri region) where a logic device will be formed. At this time, the device isolation layer 111 is formed through a local oxidation of silicon (LOCOS) process or a modified LOCOS process. However, as for a semiconductor-device with a sub-quarter micron size, the device isolation layer 111 is formed through a shallow trench isolation (STI) process.

Figure 9B:
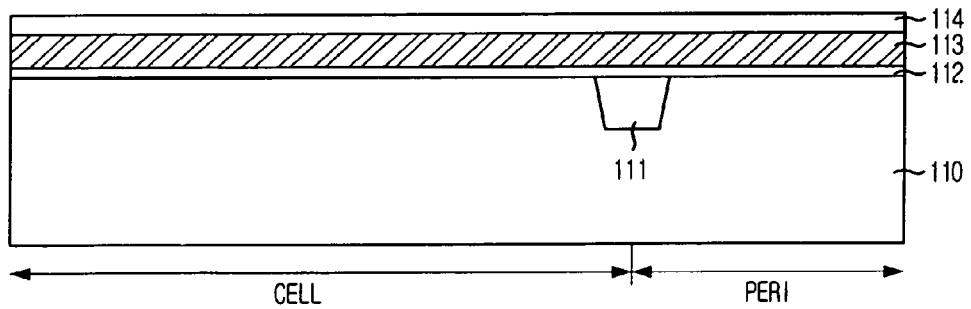

Subsequently, as shown in FIG. 9B, a tunnel insulation layer 112 is formed on an entire surface of the substrate 110 provided with the device isolation layer 111. At this time, the tunnel oxide layer is formed by using an oxide layer, a nitride layer or an oxynitride layer. As for the oxynitride layer, a predetermined portion of a nitrogen component is contained in an oxide layer. The tunnel insulation layer 112 is formed in a thickness ranging from approximately 50 Å to approximately 500 Å. It is preferable that the tunnel insulation layer 112 is formed in a thickness ranging from approximately 60 Å to approximately 250 Å. For instance, in case of using the oxide layer, the oxide layer can be formed by performing a thermal oxidation process to the substrate 110.

Next, a first polysilicon layer 113 for a floating gate is formed on the tunnel insulation layer 112. At this time, the first polysilicon layer 113 is formed by using a doped or undoped polysilicon layer in a thickness ranging from approximately 100 Å to approximately 5,000 Å. For instance, in case of using the doped polysilicon layer, the doped polysilicon layer is formed through a low pressure chemical vapor deposition (LPCVD) method using a silane ($SiH_4$) gas and a phosphine ($PH_3$) gas, or a disilane ($Si_2H_6$) gas and a $PH_3$ gas in a thickness ranging from approximately 1,500 Å to approximately 5,000 Å. Meanwhile, in case of using the undoped polysilicon layer, the undoped polysilicon layer is formed through a LPCVD method using a $SiH_4$ gas or a $Si_2H_6$ gas. Afterwards, a subsequent impurity ion-implantation process is performed and thus, the undoped polysilicon layer is doped with an impurity.

Subsequently, although not shown, an inter-poly dielectric layer IPD is formed on the tunnel insulation layer 112. At this time, the IPD layer is formed in a stacked layer formed by stacking an oxide layer, a nitride layer or a combination thereof. For instance, the IPD layer is formed with an oxide/nitride (ON) layer or an oxide-nitride-oxide (ONO) layer.

Subsequently, a hard mask layer 114 is formed on the IPD layer. At this time, the hard mask layer 114 is formed by using an oxide layer, a nitride layer or a combination thereof in a thickness ranging from approximately 100 Å to approximately 5,000 Å. For instance, the hard mask layer 114 can be formed in an oxide/nitride (ON) structure or an oxynitride layer.

Figure 9C:
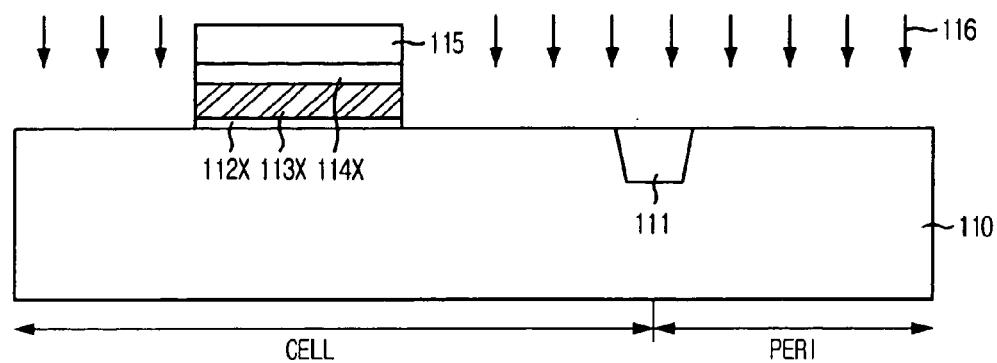

Next, as shown in FIG. 9C, a mask process is performed, thereby forming a first photoresist pattern 115 for forming a floating gate on the cell region is formed on the hard mask layer 114.

Subsequently, an etching process 116 using the first photoresist pattern 115 is employed, thereby sequentially etching the hard mask layer 114, the IPD layer (not shown), the first polysilicon layer 113 and the tunnel insulation layer 112. Herein, reference numerals 112X, 113X and 114X denote the patterned tunnel insulation layer, the patterned first polysilicon layer and the patterned hard mask layer, respectively. At this time, through the etching process 116, all of the hard mask layer 114, the IPD layer (not shown), the first polysilicon layer 113 and the tunnel insulation layer 112 are etched by using the first photoresist pattern 115. Also, the first polysilicon layer 113 and the tunnel insulation layer 112 can be etched by using remaining portions of the patterned hard mask layer 114x and the patterned IPD layer as an etch mask.

Figure 9D:
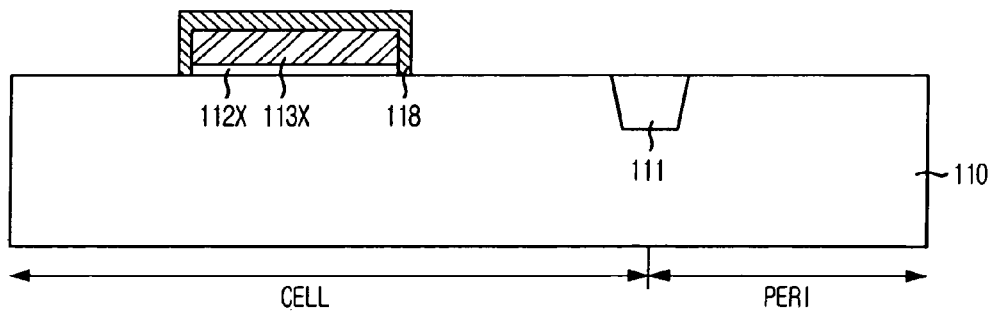

Next, as shown in FIG. 9D, a strip process is performed, thereby removing the first photoresist pattern 115. Afterwards, the remaining portions of the patterned hard mask layer 114X and the patterned IPD layer (not shown) are removed, thereby exposing the patterned first polysilicon layer 113X on the substrate 110 of the cell region.

Next, an IPD layer (not shown) for spacers is deposited and a dry etching process is performed. Thus, a dielectric layer 118 is formed to cover the patterned first polysilicon layer 113X. At this time, the dielectric layer 118 is formed with use of an oxide layer, a nitride layer or a combination thereof in a thickness ranging from approximately 50 Å to approximately 500 Å.

Figure 9E:
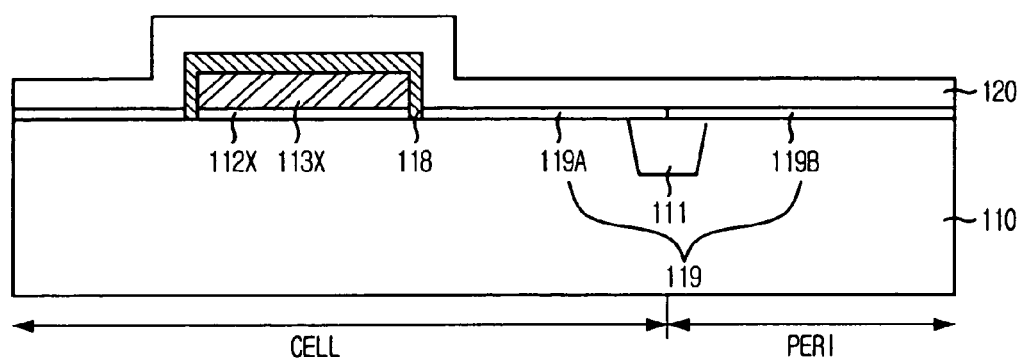

Next, as shown in FIG. 9E, a gate insulation layer 119 is formed on an upper portion of the exposed substrate 110. At this time, the gate insulation layer 119 is formed in a thickness ranging from approximately 50 Å to approximately 500 Å through an oxidation process or a chemical vapor deposition (CVD) process. The gate insulation layer 119 can be formed in a different thickness on the cell region and the peri region. For instance, in case that a transistor to be formed in the pen region is a high voltage device, the gate insulation layer 119 should be formed thickly. As mentioned above, to form the gate insulation layer 119 in a different thickness on the cell region and the peri region, a first gate insulation layer 119A is formed on the substrate 110 of the cell region and the peri region and then, the first gate insulation layer 119A existing on the substrate 110 of the pen region is removed by performing a photolithography process. Afterwards, a second gate insulation layer 119B is formed on the substrate 110 of the pen region in a different thickness from that of the first gate insulation layer 119A. In another method, an oxidation process is performed on the substrate 110 of the cell region and the pen region, thereby forming the first gate insulation layer 119A. Afterwards, an oxidation process is performed only onto the peri region again and thus, the second gate insulation layer 1198 is formed. Herein, the first gate insulation layer 119A serves a role in electrically isolating a selection gate from the substrate 110, and the second gate insulation layer 1198 formed on the peri region serves a role as a gate insulation layer of a transistor for a logic device.

Subsequently, a second polysilicon layer 120 for a selection gate of the cell region and a gate electrode of the pen region is formed over a height difference of the above resulting structure provided with the gate insulation layers 119A and 1198. At this time, similar to the method for forming the first polysilicon layer 113, the second polysilicon layer 120 is deposited by using an undoped polysilicon layer or a doped polysilicon layer in a thickness ranging from approximately 500 Å to approximately 4,000 Å through a LPCVD method. It is preferable that the second polysilicon layer 120 is formed in a thickness ranging from approximately 1,500 Å to approximately 4,000 Å.

Figure 9F:
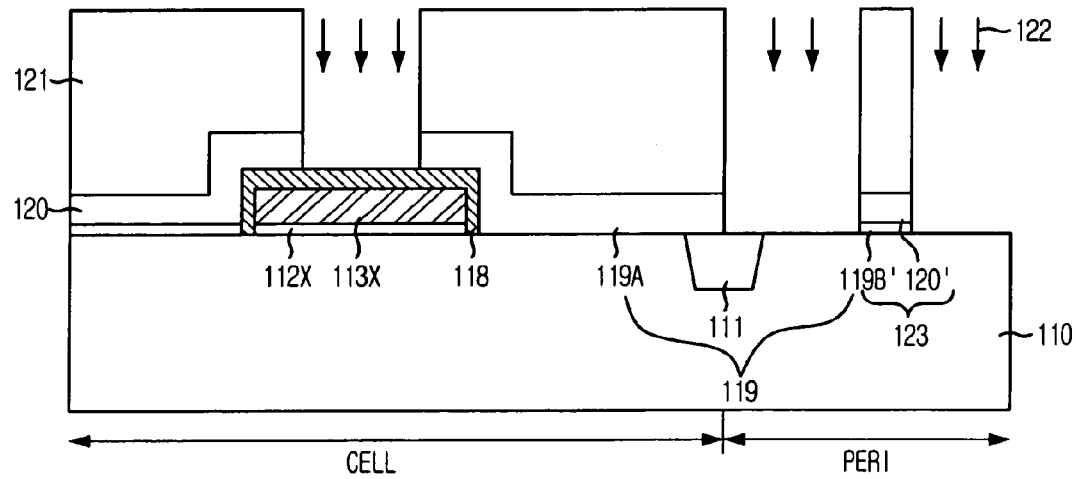

Next, as shown in FIG. 9F, a mask process is employed, thereby forming a second photoresist pattern 121 for forming a gate electrode of the peri region on the second polysilicon layer 120. At this time, the second photoresist pattern 121 is formed such as to open predetermined portions of the cell region and the peri region.

Next, an etching process 122 using the second photoresist pattern 121 as a mask is performed. Thus, the second polysilicon layer 120 and the second gate insulation layer 119B are etched in the peri region and thus, a peripheral gate electrode 123 is formed in the peri region. Herein, reference numerals 119B' and 120' denote the patterned gate insulation layer and the patterned second polysilicon layer, respectively. In the cell region, a predetermined upper portion of the dielectric layer 118 is exposed.

Figure 9G:
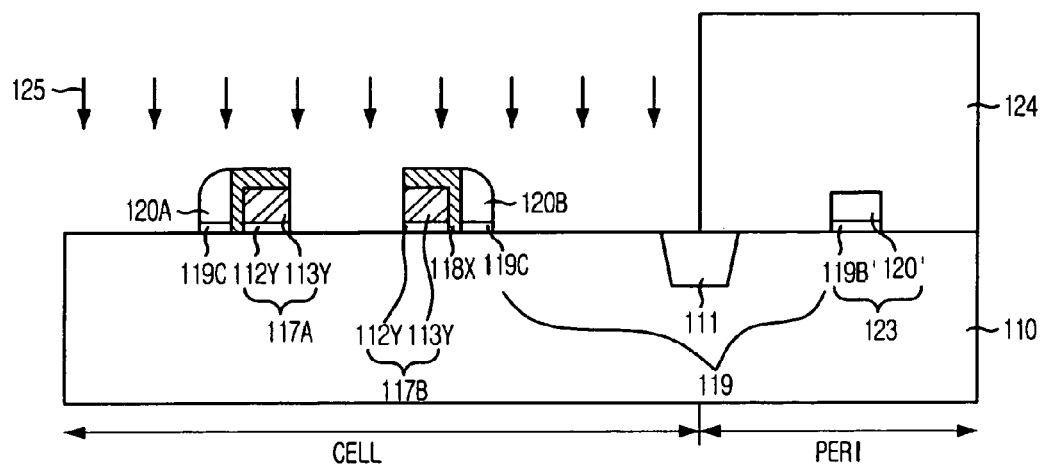

Next, as shown in FIG. 9G, a strip process is performed, thereby removing the second photoresist pattern 121. Afterwards, a mask process is employed, thereby forming a third photoresist pattern 124 covering the peri region.

Next, an etching process 125 is performed by using etch selectivity between a polysilicon layer and a dielectric layer. Thus, the dielectric layer 118 serving a role as a mask is etched and afterwards, the patterned first polysilicon layer 113X is exposed. Herein, the patterned dielectric layers are denoted with a reference numeral 118X. Thereafter, through a blanket etch process such as an etch back process, predetermined portions of the patterned first polysilicon layer 113X and the patterned tunnel insulation layer 112X are etched, thereby forming a plurality of floating gate electrodes 117A and 117B for two bits divided into two parts and a plurality of selection gates 120A and 120B covering each sidewalls of the individual etched dielectric layer 118X. Hereinafter, a reference numeral 113Y denotes a floating gate. Meanwhile, during the etching process and the etch back process, the peripheral gate electrode 123 of the peri region is not etched because the peripheral gate electrode 123 of the peri region is covered by a third photoresist pattern 124. In addition, a reference numeral 119C denotes the patterned first gate insulation layers, and a reference numeral 112Y denotes the further patterned tunnel oxide layer.

Figure 9H:
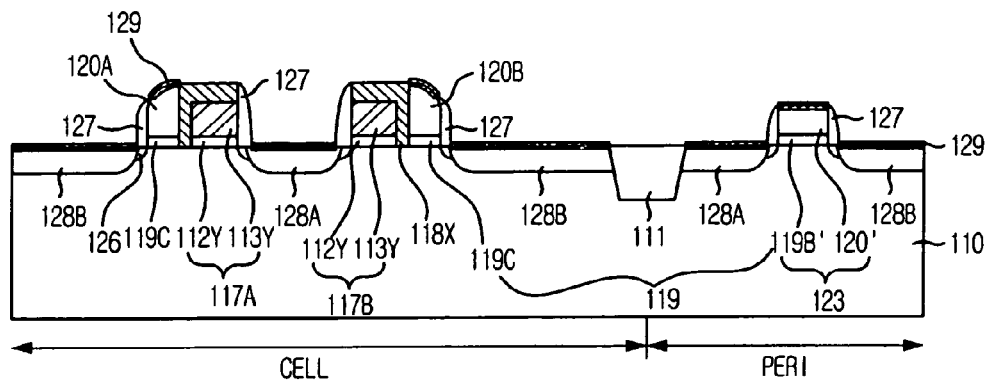

Next, as shown in FIG. 9H, a strip process is performed, thereby removing the third photoresist pattern 124.

Next, a lightly doped drain (LDD) ion-implantation process is performed. Thus, a plurality of LDD ion-implantation regions 126 (also illustrated by reference numeral 226 in FIGS. 6 and 7) are formed in the substrate 110 of the cell region exposed between the first and the second selection gates 120A and 120B, and the plurality of floating gates 113Y. In addition, a plurality of LDD ion-implantation regions 126 are formed in the substrate 110 of the peri region exposed in both side of the peripheral gate electrode 123 of the peri region. Herein, although the LDD ion-implantation regions 126 are simultaneously formed in the cell region and the peri region, the LDD ion-implantation regions 126 can be formed in the cell region and the peri region through different ion implantation methods from each other by using different doping concentrations.

Next, an insulation layer (not shown) is formed on an entire upper structure provided with the LDD ion-implantation regions 126. Afterwards, a blanket etch such as an etch back process is performed, thereby forming spacers 127 (also illustrated by reference numeral 227 in FIG. 6) on sidewalls of the selection gates 120A and 120B, the floating gates 113Y and the peripheral gate electrode 123, respectively. At this time, the spacers 127 are formed by using an oxide layer, a nitride layer or a combination thereof.

Next, a highly concentrated source/drain ion-implantation process is performed by using the spacers 127 as a mask and thus, a plurality of source/drain regions 128A and 128B are formed more deeply than the plurality of LDD ion-implantation regions 126 formed in the substrate 110 exposed to both sides of the spacers 127. Accordingly, the source region 128A with which two unit cells share is formed in the substrate 110 of the cell region. At this time, the source region 128A and the drain regions 128B can be formed either in the same concentration or in a different concentration according to each different program or cell property.

Next, a self-aligned silicide (SALICIDE) process is performed, thereby forming a plurality of metal silicide layers 129 on regions to which silicon is exposed, i.e., upper portions of the first and the second selection gates 120A and 120B, the source/drain regions 128A and 128B, and an upper portion of the peripheral gate electrode 123. At this time, the metal silicide layers 129 are formed by using one of titanium (Ti), cobalt (Co), nickel (Ni), a mixture thereof and a compound thereof.

Figure 9I:
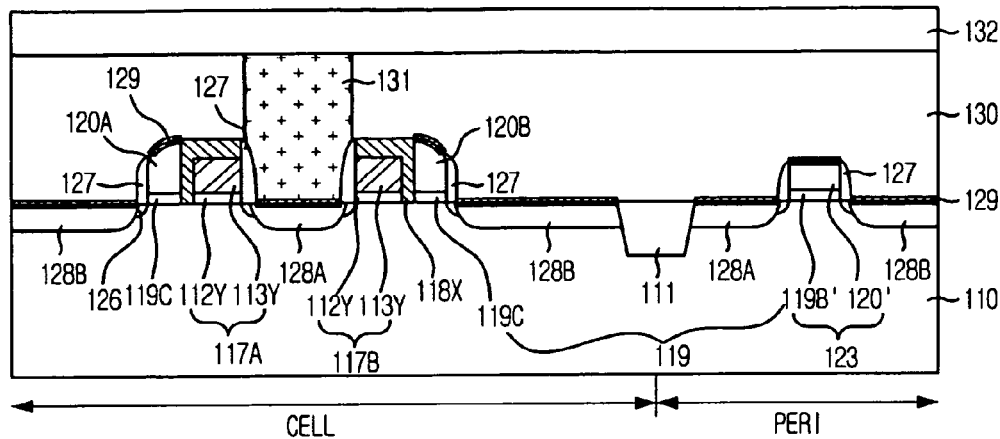

Next, as shown in FIG. 9I, an oxide-based first inter-layer insulation layer 130 (also illustrated by reference numeral 230 in FIGS. 6 and 7) is formed on an entire upper structure provided with the metal silicide layer 129. Afterwards, a lithography process is performed, thereby forming a contact hole (not shown) exposing the source region 128A of the cell region.

Next, the first inter-layer insulation layer 130 can be planarized by employing a CMP process or a high temperature thermal process.

Next, a conductive layer (not shown) is formed on the above resulting structure to fill the contact hole, thereby forming a source contact 131. At this time, the source contact 131 serves a role as a source line SL. The conductive layer is formed by using one selected from the group consisting of tungsten (W), aluminum (Al), Ti, titanium nitride (TiN), platinum (Pt), ruthenium (Ru), a combination thereof and a compound thereof.

Next, an oxide-based second inter-layer insulation layer 132 (also illustrated by reference numeral 232 in FIG. 6) is formed on the first inter-layer insulation layer 130 provided with the source contact 131 through a CVD process or a physical vapor deposition (PVD) process.

At this time, the second inter-layer insulation layer 132 and the first inter-layer insulation layer 130 are formed with oxide-based layers. For instance, the first inter-layer insulation layer 130 and the second inter-layer insulation layer 132 are formed by using one selected from the group consisting of a high density plasma (HDP) layer, a borophosphosilicate glass (BPSG) layer, a phosphosilicate glass (PSG) layer, a plasma enhanced tetraethyl orthosilicate (PETEOS) layer, a plasma enhanced chemical vapor deposition (PECVD) layer, an undoped silicate glass (USG) layer, a fluorinated silicate glass (FSG) layer, a carbon doped oxide (CDO) layer and an organo silicate glass (OSG) layer or a combination thereof.

Next, a CMP process or a high temperature thermal process is performed and thus, the second inter-layer insulation layer 132 is planarized.

Figure 9J:
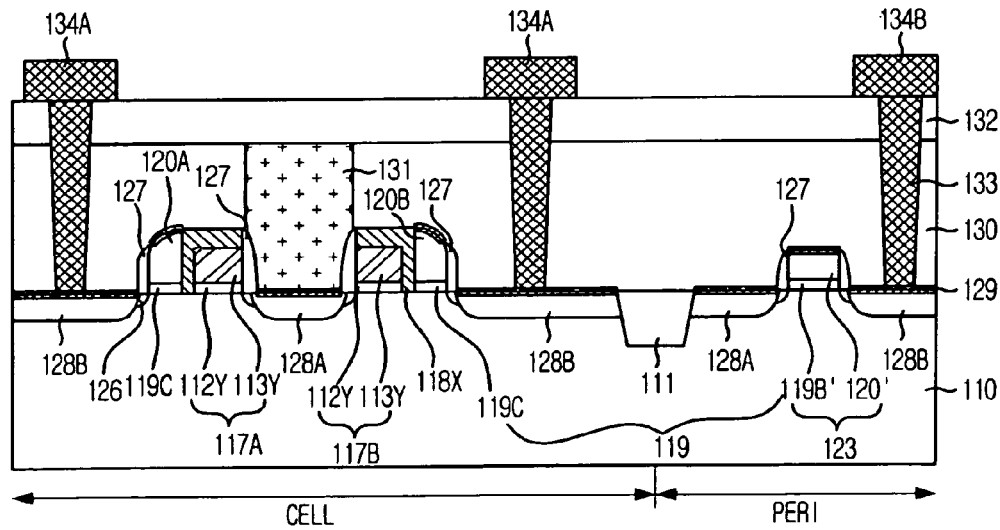

Next, as shown in FIG. 9J, a lithography process is employed, thereby forming a plurality of contact holes (not shown) exposing the drain regions 128B of the cell region and the peri region. Afterwards, a plurality of contact plugs 133 (also illustrated by reference numeral 233 in FIGS. 5, 6, and 8) buried in the contact holes are formed.

Next, a lithography process is performed, thereby forming a plurality of interconnection line layers 134A and 134B (also respectively illustrated by reference numerals 234A and 234B in FIG. 6) on the contact plugs 133 by using a conductive layer.

That is, a first interconnection line layers 134A are formed above the contact plugs 133 of the cell region and a second interconnection line layer 134B is formed above the contact plug 133 of the pen region. At this time, the first interconnection line layers 134A serve a role as a bit line BL and the second interconnection line layer 134B serves a role as an interconnection line of a logic device.

As for the method for fabricating the non-volatile memory device in accordance with a general aspect, since the selection gates 120A and 120B are formed by performing an etch back process, sidewalls of the selection gates 120A and 120B are formed in a uniform type. Thus, the spacers 127 are also uniformly formed on the sidewalls of the selection gates 120A and 120B. Accordingly, although the metal silicide layer 129 is formed through a subsequent process, an electric short-circuit between the selection gates 120A and 120B, and the substrate 110 is not generated due to the spacers 127 uniformly formed. Thus, it is possible to form the metal silicide layers 129 on the selection gates 120A and 120B of the both cells. As is well known, the metal silicide layers 129 reduce a resistance of the selection gates 120A and 120B and a contact resistance, thereby reducing a size of a whole memory cell. Furthermore, although the second polysilicon layer 120 serving a role as a selection gate is decreased as the device has been highly integrated, the selection gates 120A and 120B can be stably formed in a self-aligned method through an etch back process.

As mentioned above, it is possible to obtain various effects given below in accordance with a general aspect.

First, it is possible to reduce a channel length of a whole memory cell by forming a selection gate per unit cell only on a sidewall of a floating gate and further, to reduce a size of a memory device. That is, a channel length of a unit cell of the conventional non-volatile memory device is obtained by an expression of "a length of a floating gate+(a length of a selection gate×2)"; however, a channel length of the unit cell in accordance with the present invention can be obtained by an expression of "a length of floating gate+a length of a selection gate". Accordingly, it is possible to reduce the channel length as much as a length of the selection gate per unit cell.

Secondly, the decreased channel length of the unit cell not only reduces a size of a whole memory cell but also increases a cell current. At this time, a reduction rate of a cell size reaches at least approximately 20%.

Thirdly, as two unit cells commonly use a source region, a distance between a bit line and a source line gets wider. Accordingly, a coupling phenomenon due to a parasitic capacitance between the two lines is not happened and thus, an interference phenomenon is not generated. Accordingly, it is possible to prevent errors from being generated during a program operation and an erasion operation and to reduce a data access time.

Fourthly, since a selection gate does not exist on an upper portion of a floating gate, it is possible to reduce a height of a memory cell and further, to decrease a difficulty during an ion-implantation process and an etching process subsequently performed by the decreased height of the memory cell. Furthermore, a height of the floating gate can be freely controlled to increase a coupling ratio between the floating gate and the selection gate.

Fifthly, as a selection gate is formed only in a drain region, a channel hot electron implantation process can be applied during a program operation. Thus, a speed of the program operation can be 1,000 times faster than an F-N tunneling method.

Sixthly, a distance between a bit line and a source line, i.e., a ground line, is wider compared to the conventional memory cell and thus, a subsequent process becomes simple. In addition, it is possible to prevent degradation in yields of products resulted from a conductive fine foreign body.

Seventhly, since sidewalls of selection gates are uniformly formed as the selection gates are formed by performing an etch back process, spacers are also uniformly formed on the sidewalls of the selection gates. Accordingly, although a metal silicide layer is formed through a subsequent process, an electric short-circuit between the selection gates and the substrate is not generated due to the uniformly formed spacers.

Eighthly, it is possible to reduce a resistance of the selection gate and a contact resistance by forming the metal silicide layer, thereby reducing a whole size of the memory cell.

Lastly, since the selection gate is formed in a self-aligned method through an etch back process, although a second polysilicon layer serving a role as a selection gate is reduced due to the high integration scale of a device, it is possible to stably form the selection gate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a non-volatile memory device, comprising:
   sequentially forming a tunnel insulation layer and a first polysilicon layer on a substrate;
   patterning the first polysilicon layer and the tunnel insulation layer;
   forming a dielectric layer to cover the patterned first polysilicon layer and the patterned tunnel insulation layer;
   forming a gate insulation layer on the substrate where the substrate is exposed;
   forming a second polysilicon layer to cover the dielectric layer;
   forming a first floating gate and a second floating gate a fixed distance apart from each other, the forming of the first and second floating gates comprising:
      sequentially etching middle portions of the second polysilicon layer, the dielectric layer, the patterned first polysilicon layer, and the patterned tunnel insulation layer; and
      separating the etched layers into two parts;
   forming a first selection gate and a second selection gate contacted with sidewalls of the separated two dielectric layers and isolated from the substrate by the gate insulation layer; and
   forming a plurality of source/drain regions in portions of the substrate exposed after the etching of the middle portions.

2. The method of claim 1, further comprising, before the forming of the source/drain regions:
   forming a plurality of lightly doped drain (LDD) ion-implantation regions in the portions of the substrate exposed after the etching of the middle portions; and
   forming a plurality of spacers on exposed sidewalls of the first and the second selection gates, and exposed sidewalls of the first and the second floating gates.

3. The method of claim 1, further comprising, after the forming of the source/drain regions:
   forming a plurality of silicide layers on the first and the second selection gates and the source/drain regions.

4. The method of claim 2, further comprising, after the forming of the source/drain regions:
   forming a plurality of silicide layers on the first and the second selection gates and the source/drain regions.

5. The method of claim 1, further comprising, after the separating of the etched layers:
   selectively etching the separated first and second polysilicon layers by an etch back process.

6. The method of claim 1, further comprising, after the forming of the first polysilicon layer:
   sequentially forming an inter-poly dielectric (IPD) layer and a hard mark layer on the first polysilicon layer.

7. The method of claim 6, wherein the IPD layer and the hard mask layer are etched before the etching of the first polysilicon layer and the tunnel insulation layer to thereby form a patterned hard mask layer and a patterned IPD layer.

8. The method of claim 7, wherein the patterned hard mask layer and the patterned IPD layer are used as etch masks to etch the first polysilicon layer and the tunnel insulation layer.

9. A method of fabricating a non-volatile memory device, comprising:
   providing a substrate defined as a cell region and a peripheral region;
   sequentially forming a tunnel insulation layer and a first polysilicon layer on the substrate;
   patterning the first polysilicon layer and the tunnel insulation layer on the cell region, the patterning comprising removing the first polysilicon layer and the tunnel insulation layer formed on the peripheral region;
   forming a dielectric layer to cover the patterned first polysilicon layer and the patterned tunnel insulation layer;
   forming a gate insulation layer on the substrate where the substrate is exposed;
   forming a second polysilicon layer to cover the dielectric layer;
   forming a peripheral gate electrode by patterning portions of the second polysilicon layer and the gate insulation layer formed on the peripheral region;
   forming a first floating gate and a second floating gate a fixed distance apart from each other, the forming of the first and second floating gates comprising:
      sequentially etching middle portions of the second polysilicon layer, the dielectric layer, the patterned first polysilicon layer, and the patterned tunnel insulation layer formed on the cell region; and
      separating the etched layers into two parts;
   forming a first selection gate and a second selection gate contacted with sidewalls of the separated two dielectric layers and isolated from the substrate by the gate insulation layer; and
   forming a plurality of first source/drain regions and a plurality of second source/drain regions in respective portions of the substrate defined as the cell region and the peripheral region that were exposed after the etching of the middle portions.

10. The method of claim 9, further comprising, before the forming of the first and second source/drain regions:
    forming a plurality of lightly doped drain (LDD) ion-implantation regions in the respective portions of the substrate defined as the cell region and the peripheral region that were exposed after the etching of the middle portions; and
    forming a plurality of spacers on exposed sidewalls of the first and the second selection gates, and exposed sidewalls of the first and the second floating gates.

11. The method of claim 9, further comprising, after the separating of the etched layers:
    selectively etching the separated first and second polysilicon layer by an etch back process.

12. The method of claim 9, further comprising, after the forming of the first polysilicon layer:
    sequentially forming an inter-poly dielectric (IPD) layer and a hard mask layer on the first polysilicon layer.

13. The method of claim 12, wherein the IPD layer and the hard mask layer are etched before the etching of the first polysilicon layer and the tunnel oxide layer.

14. The method of claim 13, wherein the patterned hard mask layer and the patterned IPD layer are used as etch masks to etch the first polysilicon layer and the tunnel insulation layer.

15. The method of claim 1, wherein the first selection gate and the second selection gate are formed from a portion of the second polysilicon layer that remains after the etching of the second polysilicon layer.

16. The method of claim 9, wherein the first selection gate and the second selection gate are formed from a portion of the second polysilicon layer that remains after the etching of the second polysilicon layer.

* * * * *